(12) United States Patent
Imanishi et al.

(10) Patent No.: US 7,387,229 B2
(45) Date of Patent: Jun. 17, 2008

(54) METHOD OF FORMING BUMPS ON A WAFER UTILIZING A POST-HEATING OPERATION, AND AN APPARATUS THEREFORE

(75) Inventors: Makoto Imanishi, Neyagawa (JP);
Shoriki Narita, Hirakata (JP);
Masahiko Ikeya, Neyagawa (JP);
Shinji Kanayama, Kashihara (JP);
Takaharu Mae, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 603 days.

(21) Appl. No.: 10/761,412

(22) Filed: Jan. 22, 2004

(65) Prior Publication Data
US 2004/0149803 A1    Aug. 5, 2004

Related U.S. Application Data

(62) Division of application No. 09/719,768, filed on Dec. 18, 2000, now Pat. No. 6,787,391.

(51) Int. Cl.
*B23K 37/04* (2006.01)
(52) U.S. Cl. .......................... 228/8; 228/49.5; 438/108
(58) Field of Classification Search .................. 228/8, 228/9, 102, 231, 180, 22, 232, 220, 1.1, 110.1, 228/180.21, 48, 49.1, 49.2; 438/108, 106, 438/612, 613; 29/25.1
See application file for complete search history.

(56) References Cited

U.S. PATENT DOCUMENTS

| | | |
|---|---|---|
| 4,024,560 A | 5/1977 | Miller et al. |
| 4,518,848 A | 5/1985 | Weber |
| 4,846,623 A | 7/1989 | Otani et al. |
| 5,294,038 A * | 3/1994 | Nakano ................... 228/179.1 |
| 5,430,271 A * | 7/1995 | Orgami et al. .............. 219/388 |

(Continued)

FOREIGN PATENT DOCUMENTS

JP    64-12555    1/1989

(Continued)

OTHER PUBLICATIONS

Patent Abstracts of Japan, vol. 1996, No. 07, Jul. 31, 1996 & JP 08 078418 A (Toshiba Corp.), Mar. 22, 1996—English Abstract.

(Continued)

*Primary Examiner*—Jonathan Johnson
*Assistant Examiner*—Michael Aboagye
(74) *Attorney, Agent, or Firm*—Wenderoth, Lind & Ponack, LLP

(57) ABSTRACT

A bump forming apparatus which carries out a temperature control of a type different from the conventional art in forming bumps to a semiconductor wafer, and a bump formation method executed by the bump forming apparatus are provided. A bonding stage, a load and transfer device and a control device are provided. A wafer, after having bumps formed thereon, is held by the load and transfer device and arranged above the bonding stage through control by the control device, so that a temperature drop of the wafer is controlled. Accordingly, generation of troubles such as a crack because of thermal stress and the like can be prevented to even compound semiconductor wafers sensitive to a temperature change.

7 Claims, 15 Drawing Sheets

U.S. PATENT DOCUMENTS

| | | | |
|---|---|---|---|
| 5,489,192 A | 2/1996 | Taniguchi | |
| 5,664,254 A | 9/1997 | Ohkura et al. | |
| 5,665,639 A * | 9/1997 | Seppala et al. | 438/15 |
| 5,817,178 A | 10/1998 | Mita et al. | |
| 5,848,868 A | 12/1998 | Suzuki et al. | |
| 5,905,302 A * | 5/1999 | Lane et al. | 257/678 |
| 5,984,165 A * | 11/1999 | Inoue et al. | 228/180.22 |
| 6,053,398 A | 4/2000 | Iizuka et al. | |
| 6,302,317 B1 | 10/2001 | Narita et al. | |
| 6,329,640 B1 * | 12/2001 | Narita et al. | 219/390 |
| 6,349,447 B1 | 2/2002 | Zimmer | |
| 6,439,447 B1 | 8/2002 | Minamitani et al. | |
| 6,494,358 B2 | 12/2002 | Narita et al. | |
| 6,506,222 B2 | 1/2003 | Minamitani et al. | |
| 6,544,377 B1 | 4/2003 | Minamitani et al. | |
| 6,568,580 B2 | 5/2003 | Narita et al. | |

FOREIGN PATENT DOCUMENTS

| | | |
|---|---|---|
| JP | 6-232132 | 8/1994 |
| JP | 7-153763 | 6/1995 |
| JP | 8-78418 | 3/1996 |
| JP | 09-050957 | 2/1997 |
| JP | 09-28941 | 4/1997 |
| WO | 96/41109 | 12/1996 |

OTHER PUBLICATIONS

N. Miyazaki et al., "Thermal shock cracking of lithium niobate single crystal", Journal of Materials Science, Materials in Electronics, Chapman & Hall, vol. 8, No. 3, pp. 133-138 (1997).

* cited by examiner

METHOD OF FORMING BUMPS ON A WAFER UTILIZING A POST-HEATING OPERATION, AND AN APPARATUS THEREFORE

This application is a Divisional application of Ser. No. 09/719,768 filed Dec. 18, 2000, which is currently now U.S. Pat. No. 6,787,391.

TECHNICAL FIELD

The present invention relates to a bump forming apparatus for forming bumps on semiconductor wafers, and a bump formation method carried out by the bump forming apparatus.

BACKGROUND ART

In recent years, electronic components have been made more and more compact in accordance with miniaturization of devices, e.g., portable phones and the like on which the electronic components are mounted. Thus, there is a bump forming apparatus for this purpose which forms bumps to electrode portions at each circuit formation part on a semiconductor wafer without separating the circuit formation part from the semiconductor wafer. The bump forming apparatus of this kind includes a carry-in device for taking out a semiconductor wafer before bumps are formed thereto from a first storage container where the semiconductor wafers without bumps are stored, a second storage container for storing wafers with the bumps formed, a bonding stage where wafers without bumps are placed and heated generally to about 250-270° C. so as to join the electrode portions and bumps, a carry-out device for storing the wafers after the bumps are formed thereon into the second storage container, and a transfer device for transferring the wafers from the carry-in device to the bonding stage and from the bonding stage to the carry-out device.

Meanwhile, as a SAW (Surface Acoustic Wave) filter used in the aforementioned portable phones and the like, there are some semiconductor wafers having a substrate of the wafer not formed of silicon as in the prior art but formed of quartz, or a compound semiconductor wafer such as lithium tantalum, lithium niobium, gallium arsenide or the like. Although the compound semiconductor wafer of this type is heated as well to approximately 150° C. at maximum in forming the bumps, it is necessary for the heating and cooling speed of the compound semiconductor wafer to be lowered in comparison with the conventional silicon wafer. Unless the cooling is carried out slowly, the compound semiconductor wafer is accompanied by a pyroelectric effect thereby breaking circuits, or the wafer is thermally deformed to crack in some cases.

As such, a bump forming apparatus for forming bumps to the compound semiconductor wafers needs a different way of temperature control from the control in the conventional bump forming apparatus which forms bumps to silicon wafers.

The present invention has for its object to provide a bump forming apparatus which executes temperature control different from the prior art before and after forming bumps to semiconductor wafers, and a bump formation method carried out by the bump forming apparatus.

SUMMARY OF THE INVENTION

In order to accomplish the above and other objects, a bump formation method is provided according to a first aspect of the present invention for forming bumps onto electrodes of a circuit formed to a semiconductor wafer. In the bump formation after bonding the bumps on the semiconductor wafer by practical heating for bump formation and method, before storing the semiconductor wafer in a storage container, a post-heating operation in which a temperature drop of the semiconductor wafer is controlled is performed on the semiconductor wafer.

In a second aspect of the present invention, a preheating operation is performed on the semiconductor wafer before the semiconductor wafer is practically heated in addition to the bump formation method of the first aspect.

In a bump formation method according to a fifth aspect of the present invention, before the bump bonding is carried out after the semiconductor wafer is placed on a bonding stage which heats the semiconductor wafer to a temperature for bump bonding in the practical heating, a temperature difference between a temperature at a side of a stage contact face of the semiconductor wafer in contact with the bonding stage and a temperature at a side of a circuit formation face of the semiconductor wafer opposite to the stage contact face may be controlled in addition to the bump formation method of the first aspect. Thus, the semiconductor wafer placed on the bonding stage is maintained within a warpage non-generation temperature range in which a warpage of the semiconductor wafer is restricted to a level not obstructing the bump formation.

A bump forming apparatus provided according to a third aspect of the present invention has a bonding stage where a semiconductor wafer is placed and which practically heats the semiconductor wafer to a temperature for bump bonding necessary to form bumps on electrodes formed to a circuit of the semiconductor wafer. In addition, a bump forming head is placed above the bonding stage for forming the bumps onto the electrodes of the semiconductor wafer, and a load and transfer device is provided for putting and removing the semiconductor wafer on the bonding stage. Furthermore, a post-heating device is provided for cooling the semiconductor wafer based on a temperature drop control to the semiconductor wafer after bumps are bonded on the practically heated semiconductor wafer.

In a bump forming apparatus according to a fourth aspect of the present invention, a preheating device can be additionally provided for the bump forming apparatus of the third aspect for carrying out a preheating operation on the semiconductor wafer before the semiconductor wafer placed on the bonding stage is heated to the temperature for bump bonding.

A bump forming apparatus according to a sixth aspect of the present invention may have a wafer temperature control device added to the bump forming apparatus of the third aspect. Before the bump bonding is carried out after the semiconductor wafer is placed on the bonding stage, the wafer temperature control device controls the temperature difference between a temperature at a side of a stage contact face of the semiconductor wafer placed on the bonding stage in contact with the bonding stage and a temperature at a side of a circuit formation face of the semiconductor wafer opposite to the stage contact face so that the temperature difference is within a warpage non-generation temperature difference range where a warpage of the semiconductor wafer is restricted to a level not obstructing the bump formation.

According to the bump formation method in the first aspect and the bump forming apparatus in the third aspect of the present invention, the post-heating device executes the post-heating operation for controlling a temperature drop of the wafer after bumps are formed on the wafer. Thus, generation of troubles such as a circuit break due to a pyroelectric effect, a crack by thermal deformation and the like can be prevented even when compound semiconductor wafers sensitive to a temperature change are handled.

In the bump formation method of the second aspect and the bump forming apparatus of the fourth aspect of the present invention, the preheating device is further provided in addition to the post-heating device, thereby heating the semiconductor wafer while controlling a temperature rise of the wafer before bumps are formed on the wafer. Thus, even when compound semiconductor wafers sensitive to a temperature change are handled, generation of troubles such as a circuit break by a pyroelectric effect, a crack by thermal deformation and the like can be further prevented.

In the bump formation method of the fifth aspect and the bump forming apparatus of the sixth aspect of the present invention, the wafer temperature control device is additionally set to execute temperature control on the semiconductor wafer placed on the bonding stage to suppress a warpage of the semiconductor wafer to a level not obstructing the bump formation. Thus, the semiconductor wafer can be maintained in a nearly flat state even at high temperatures, e.g., 200-250° C., so that bumps can be formed on the semiconductor wafer at the high temperatures.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

First Embodiment

Figure 1:
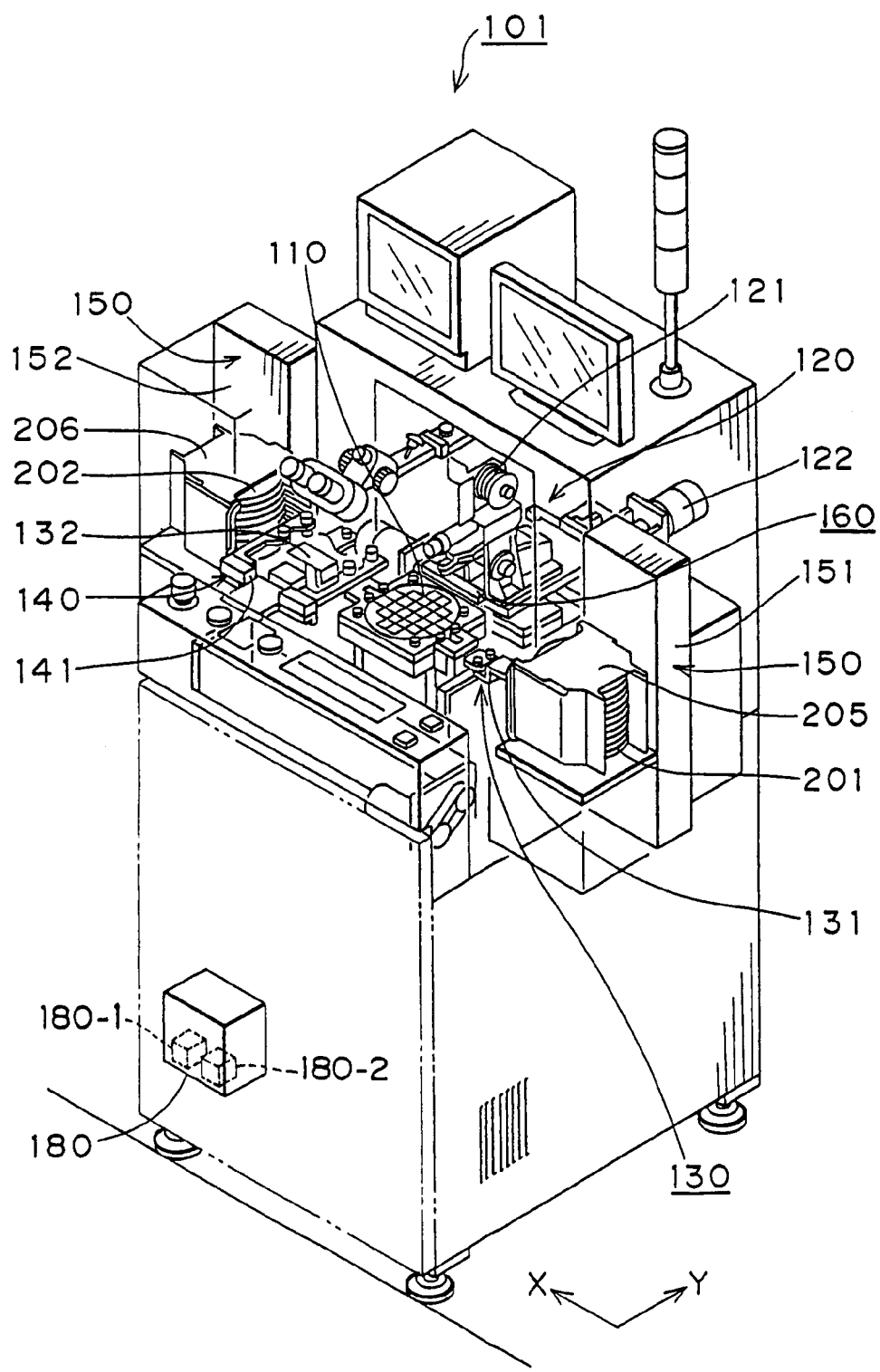
FIG. 1 is a perspective view of a bump forming apparatus according to an embodiment of the present invention.

A bump forming apparatus according to an embodiment of the present invention and a bump formation method carried out by the bump forming apparatus will be described with reference to the drawings, in which like parts are designated by like reference numerals. A bump forming apparatus 101 according to this embodiment shown in FIG. 1 is appropriate to process the earlier mentioned compound semiconductor wafers and will be discussed in the following description in relation to forming bumps on the compound semiconductor wafers. However, an object to be processed by the apparatus is not limited to the compound semiconductors, and the apparatus can also process conventional silicon wafers. In such a case, wafers on which bumps are formed are heated up to approximately 250-270° C. as described before. The bump forming apparatus 101 has a first storage container 205 for storing compound semiconductor wafers 201 in layers before bumps are formed, and a second storage container 206 for storing compound semiconductor wafers 202 in layers after bumps are formed (that is, the apparatus is a double magazine type). However, the apparatus is not restricted to this type and can be formed as a so-called single magazine type with one storage container for storing both the compound semiconductor wafers 201 without bumps and the compound semiconductor wafers 202 with bumps.

The bump forming apparatus 101 is fundamentally not different from the bump forming apparatus of the prior art. That is, the bump forming apparatus 101 roughly consists of one bonding stage 110, one bump forming head 120, transfer devices 130, one load and transfer device 140, lifting devices 150 connected to the above storage containers 205, 206 for moving up and down the storage containers 205, 206 respectively, and a control device 180. As will be described later in relation to the operation of the bump forming apparatus 101, the apparatus is greatly different from the conventional apparatus in its operation under the control of the above control device 180 so as to effectuate temperature control to particularly prevent compound semiconductor wafers from cracking or the like. Each of the above parts constituting the apparatus will be described below.

The bonding stage 110 has thereon the compound semiconductor wafer before bumps are formed (referred to simply as "pre-wafer" hereinbelow) 201, and heats the pre-wafer 201 to a temperature for bump bonding which is necessary for forming bumps onto electrodes of circuits formed on the pre-wafer 201.

The bump forming head 120 is a known device for forming bumps on the electrodes of the pre-wafer 201 loaded on the bonding stage 110 and heated to the temperature for bump bonding. The bump forming head not only has a wire supply part 121 for supplying a gold wire as a material for the bumps, but also has a bump formation part for melting the gold wire thereby forming a ball and pressing the molten ball to the electrode, and an ultrasonic wave generation part for applying ultrasonic waves to the bump at the time of the above pressing. The thus constituted bump forming head 120 is set on an X, Y-table 122 having, for example, ball screw structures movable in X, Y-directions orthogonal to each other on a plane, and moved in the X, Y-directions by the X, Y-table 122 so that a bump can be formed on each of the electrodes of the fixed pre-wafer 201.

Figure 2:
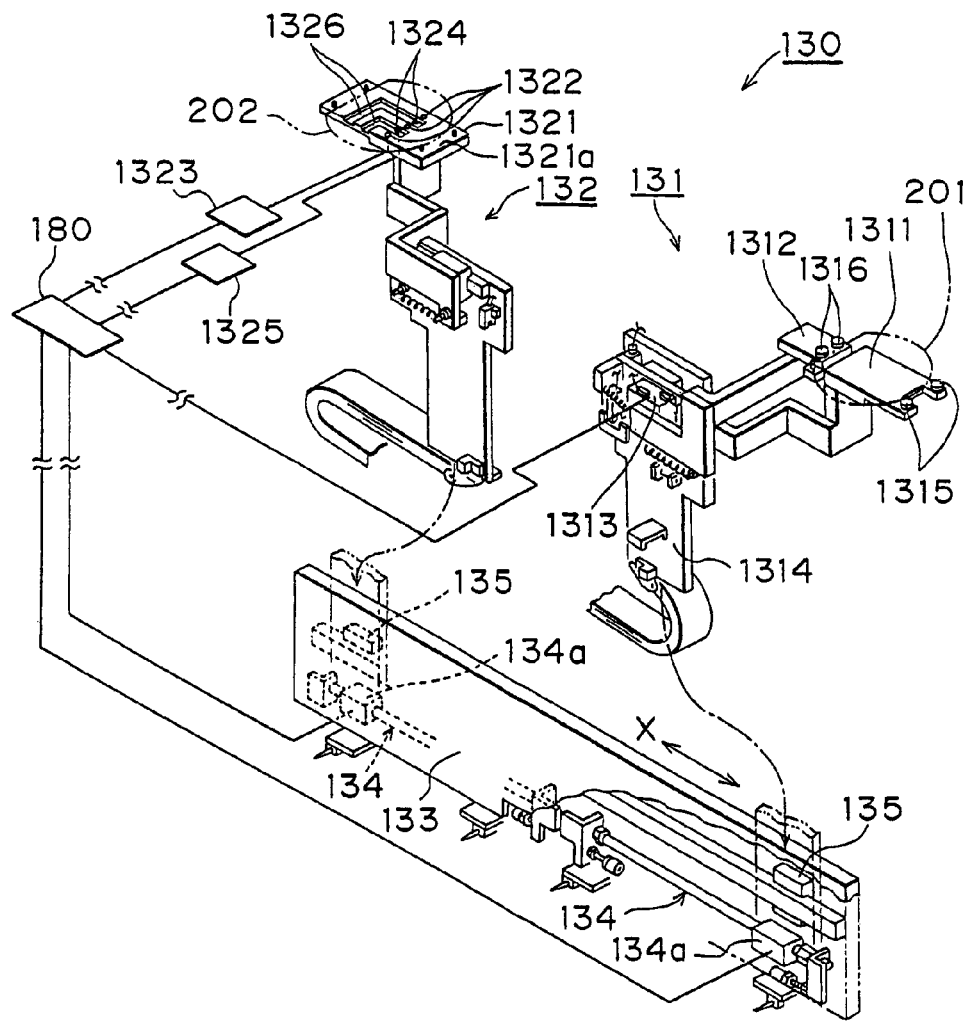
FIG. 2 is a perspective view of a transfer device shown in FIG. 1.

The bump forming apparatus 101 has transfer devices 130 of two kinds. A carry-in device 131 comprising one of the transfer devices is a device for taking out the pre-wafer 201 from the first storage container 205, while a carry-out device 132 comprising the other of the transfer devices is a device for transferring and storing the compound semiconductor wafer after bumps are formed (referred to simply as "post-wafer" below) 202 to the second storage container 206. More specifically, as indicated in FIG. 2, the above carry-in device 131 and the above carry-out device 132 are arranged side by side in the X direction. The devices are moved independently of each other by movable parts 134a including rodless cylinders 134 fixed to a frame 133 while being guided by guide members 135 secured to the frame 133. As shown in FIG. 1, between the carry-in device 131 and carry-out device 132 is the bonding stage 110. Therefore the carry-in device 131 moves between the first storage container 205 and bonding stage 110, and the carry-out device 132 moves between the bonding stage 110 and second storage container 206.

The carry-in device 131 has, as shown in FIG. 2, a move-side holding member 1311 and a fixed-side holding member 1312 which are both connected to a supporting member 1314. The pre-wafer 201 can be loaded on the move-side holding member 1311. The move-side holding member 1311 can be moved in a diametrical direction of the pre-wafer 201 by a driving part 1313 set to the supporting member 1314 and having an air cylinder. The driving part 1313 moves the move-side holding member 1311 in a direction away from the fixed-side holding member 1312, namely, in an open direction. On the other hand, moving the move-side holding member 1311 in a direction approaching the fixed-side holding member 1312 (i.e., in a close direction) is done by an urging force of an elastic member such as a spring or the like. The move-side holding member 1311 is moved in the open direction to move the carry-in device 131 by the movable part 134a of the rodless cylinder 134 to a position corresponding to the pre-wafer 201 in the first storage container 205. Then the holding member 1311 is moved in the close direction, whereby the pre-wafer 201 is caught by positioning rollers 1315 attached to the move-side holding member 1311 and position regulation rollers 1316 attached to the fixed-side holding member 1312. The first storage container 205 is attached to a first lifter 151 constituting the lifting device 150. The first lifter 151 moves the first storage container 205 up and down so that the pre-wafer 201 is at a position where the wafer can be taken out by the carry-in device 131. The pre-wafer 201 taken out from the first storage container 205 by the carry-in device 131 is held by the load and transfer device 140. The above-described operation of the carry-in device 131 is controlled by the control device 180.

The carry-out device 132 has a loading member 1321 for loading thereon post-wafer 202 transferred from the load and transfer device 140. The loading member 1321 has a plurality of suction holes 1322 for sucking and holding the post-wafer 202. The holes 1322 formed in an array corresponding to nearly central parts of loaded post-wafer 202 are connected to a suction device 1323 controlled by the control device 180. In one feature of this embodiment, the carry-out device 132 is provided with a plurality of air blast holes 1324 formed adjacent to the suction holes 1322 for jetting a gas for controlling the cooling of the post-wafer 202. These air blast holes 1324 are connected to an air blast device 1325 controlled in operation by the control device 180. Post-wafer 202 loaded on the loading member 1321 can be cooled more slowly than in the case of natural cooling by the temperature-controlled gas (i.e., temperature-controlled air in the embodiment which is jetted from the air blast holes 1324 by the air blast device 1325). The air jetted out from the air blast holes 1324 is discharged outside the loading member 1321 through discharge grooves 1326 formed in the loading member 1321. The air blast holes 1324 are opened to the discharge grooves 1326, while the suction holes 1322 are opened to a surface 1321a of the loading member 1321 to which the post-wafer 202 comes in contact. Since the air jetted from the air blast holes 1324 passes the discharge grooves 1326, the problem in that the post-wafer 202 is blasted off the loading member 1321 because of the jetted air is eliminated. The number of air blast holes 1324, discharge grooves 1326 and suction holes 1322 is not limited to the number indicated in the drawing.

The above air blast holes 1324, air blast device 1325 and discharge grooves 1326 may also be arranged on a member of the carry-in device 131 where wafer 201 is loaded, loaded (i.e., to the move-side holding member 1311 in the embodiment).

Figure 3:
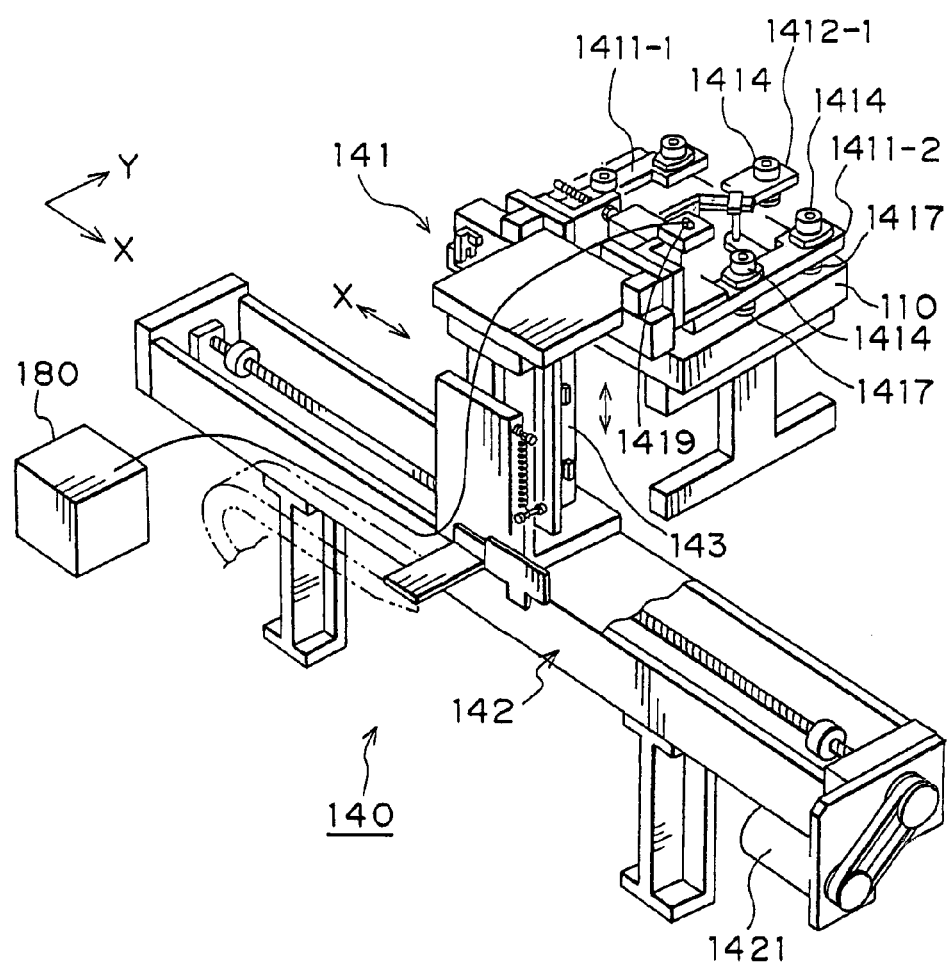
FIG. 3 is a perspective view of a load and transfer device shown in FIG. 1.

The load and transfer device 140 shifts the pre-wafer 201 from the above-described carry-in device 131 to the bonding stage 110, and shifts the post-wafer 202 from the bonding stage 110 to the carry-out device 132. As shown in FIG. 3, the load and transfer device has one holding part 141 for holding wafer 201, 202, a drive part 142 having a ball screw structure driven by a motor 1421 for moving the holding part 141 in the X-direction, and a move part 143 for moving the holding part 141 up and down in a thicknesswise direction of the held wafer 201, 202. The holding part 141 can be disposed immediately above each of the bonding stage 110, move-side holding member 1311 and fixed-side holding member 1312 of the carry-in device 131, and loading member 1321 of the carry-out device 132, thereby transferring the wafer 201, 202 among the bonding stage, carry-in device 131 and carry-out device 132 through the up, down movement by the move part 143. The load and transfer device 140 constituted as above is controlled in operation by the control device 180. As is indicated in FIG. 3, the load and transfer device 140 may be equipped with a temperature measuring device 1419 which can measure a temperature of the held wafer 201, 202 in a noncontact state (without contacting the wafer) and send the measured result to the control device 180.

Figure 5:
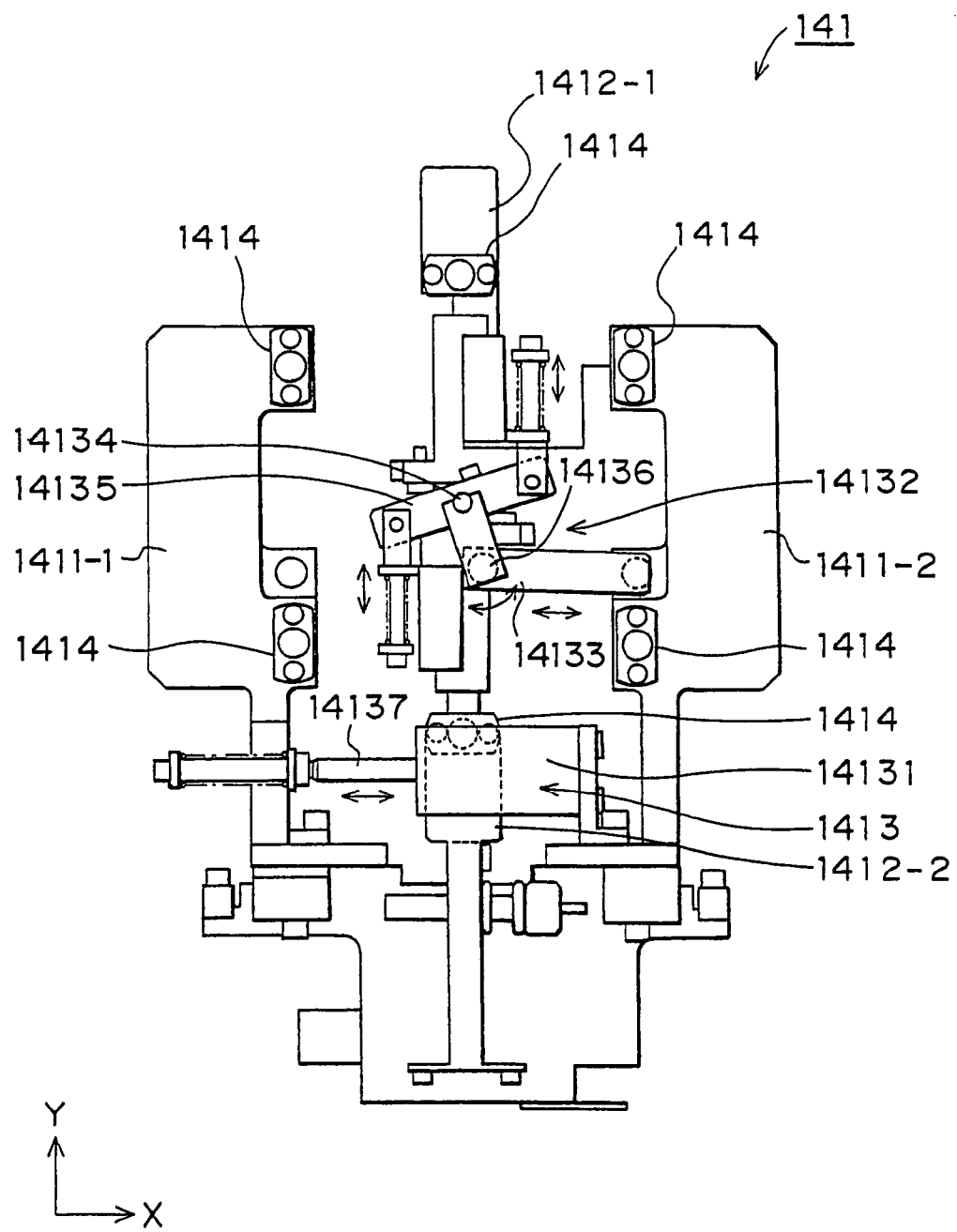
FIG. 5 is a plan view of the load and transfer device of FIG. 3.
Figure 6:
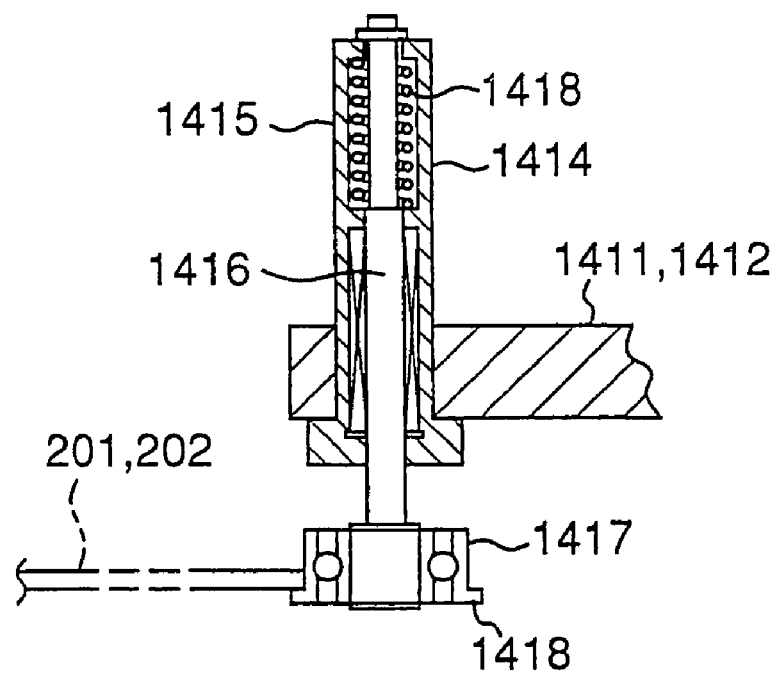
FIG. 6 is a sectional view of a clamp mechanism of the load and transfer device of FIG. 3.

As shown in FIGS. 3 and 5, the holding part 141 includes, according to one of the features of the embodiment, a pair of first clamp members 1411-1, 1411- (referred to as a "first clamp member 1411" collectively in some cases) and a pair of second clamp members 1412-1, 1412-2 (referred to as a "second clamp member 1412" collectively in some cases) for holding the wafers 201, 202 respectively in two directions orthogonal to each other in each plane of the wafers 201, 202. The holding part 141 also has a driving mechanism 1413 for bringing the first clamp members 1411-1, 1411-2 and second clamp members 1412-1, 1412-2 away from each other and close to each other. Two units of clamp mechanisms 1414 are arranged at positions opposite to each other between the first clamp member 1411-1 and first clamp member 1411-2 of the first clamp member 1411, and clamp mechanisms 1414 of one unit are arranged at positions opposite to each other between the second clamp member 1412-1 and second clamp member 1412-2 of the second clamp member 1412. Each of these clamp mechanisms 1414 has, as is clear in FIG. 6, a housing 1415, a pin 1416 penetrating the first clamp member 1411, second clamp member 1412 in a thicknesswise direction thereof which moves slidably in the housing 1415 along an axis direction thereof, a holding metal fitting 1417 fitted to an end part of the pin 1416 in a state so as to be rotatable in a direction about an axis of the pin 1416 and having a drop prevention flange 1418 for the wafer 201, 202, and a spring 1420 installed in the housing 1415 for urging the pin 1416 in the axis direction. The clamp mechanisms 1414 are set at 6 points via an almost equal distance along the periphery of the wafer 201, 202 held by the first clamp member 1411 and second clamp member 1412, so that the holding metal fittings 1417 hold the wafer 201, 202 at the 6 points.

The embodiment is provided with not only the first clamp member 1411, but also with the second clamp member 1412, thereby holding the wafer 201, 202 at 6 points spaced apart at almost equal distances as mentioned above. Accordingly, application of a dynamically biased stress to the wafer 201, 202, and moreover, application of a thermally biased temperature distribution to the wafer are eliminated. Since the holding metal fittings 1417 hold the wafer 201, 202 while maintaining contact with the periphery of the wafer 201, 202, especially the post-wafer 202 in a heated state, heat is transmitted from the post-wafer 202 to the holding metal fittings 1417. However the holding metal fittings 1417 apply no thermally biased temperature distribution to the post-wafer 202 even when holding the post-wafer 202, because the holding metal fittings 1417 are arranged at 6 points spaced apart at almost equal distances. In the arrangement of the embodiment in which both the first clamp member 1411 and the second clamp member 1412 are provided and also the wafer 201, 202 is held at 6 points via the almost equal distance, generation of troubles such as the earlier-discussed cracks or the like to the compound semiconductor wafers which are sensitive to a temperature change and need to be cooled more slowly than silicon wafers particularly after bumps are formed thereon is effectively prevented.

Furthermore, since the pins 1416 are movable in the axis direction, the holding metal fittings 1417 can move in the axis direction as well. For instance, the heated post-wafer 202 is sometimes accompanied with warpage because of the heat when held on the bonding stage 110. The post-wafer 202 returns from the above deflect state to the original flat state while being cooled when held by the holding metal fittings 1417. The holding metal fittings 1417 can move in the axis direction following the restoration of the post-wafer 202 and, therefore, the clamp mechanisms 1414 prevent generation of a stress to the wafer 202.

The driving mechanism 1413 for bringing the first clamp members 1411 and second clamp members 1412 close to or away from each other respectively has a cylinder 14131 as a driving source and a second clamp member moving mechanism 14132 for moving each of the second clamp members 1412-1, 1412-2 synchronously with the movement of the clamp member 1411-2. The second clamp member moving mechanism 14132 has a structure in which a first member 14133 coupled at one end to the first clamp member 1411-2 is coupled to a second member 14135 rotatable in a circumferential direction of a rotational center shaft 14134 via a joint part 14136. The first member 14133 moves in accordance with the movement of the first clamp member 1411-2 in the X-direction, and consequently the second member 14135 rotates, thereby moving the second clamp member 1412 in the Y-direction.

The driving mechanism 1413 operates in a manner as described hereinbelow. In order to separate the first clamp member 1411 and second clamp member 1412 to receive the wafer 201, 202, the cylinder 14131 operates to extend an output shaft 14137 in the X-direction until the first clamp member 1411-1 coupled to the output shaft 14137 butts with a stopper in the X-direction. The first clamp member 1411-2 moves in the X-direction as the movement of the first clamp member 1411-1 is stopped by the stopper. In accordance with this movement of the first clamp member 1411-2, the second clamp member 1412 moves in the Y-direction by the action of the second clamp member moving mechanism 14132 as described above. In the case where the first clamp member 1411 and second clamp member 1412 are to be separated from each other as described above, the first clamp member 1411-1 moves first, then the first clamp member 1411-2 and the second clamp member 1412 move simultaneously. On the other hand, in the case where the first clamp member 1411 and second clamp member 1412 are to be brought close to each other so as to hold the wafer 201, 202, the first clamp member 1411-2 and second clamp member 1412 move at the same time due to the action of the cylinder 14131, and then the first clamp member 1411-1 moves.

A time difference is set as above in operation timing between the first clamp member 1411-2 and second clamp member 1412, and the first clamp member 1411-1, which prevents a force from acting at one time upon the wafer 201, 202 particularly when the wafer 201, 202 is held.

According to the embodiment, the above-described bonding stage 110, the load and transfer device 140, and the control device 180 constitute a preheating device for the pre-wafer 201 and a post-heating device. Although one control device 180 controls the operation of the preheating device and post-heating device in the present embodiment, a second control device 180-2 and a first control device 180-1 may be provided to correspond to the preheating device and the post-heating device, respectively, for controlling the devices. In addition, the carry-out device 132 from which the temperature-controlled gas is jetted through air blast holes 1324 formed in the loading member 1321 by the air blast device 1325, or a modified example of the carry-out device with an insulating material on the loading member which will be described later and shown in FIGS. 11-13 may be included in the post-heating device.

Alternatively, each group having the bonding stage 110, the load and transfer device 140, and the control device 180 can be constructed as the above preheating device and the post-heating device, respectively. In this constitution, each of control devices for the preheating device and the post-heating device may be integrated to one. Further in the constitution, the carry-out device 132 to which the temperature-controlled gas is jetted or the carry-out device with the insulating material may be similarly included in the post-heating device.

Operation of the bump forming apparatus 101 in the embodiment constituted as described hereinabove will be depicted below. The operation is controlled by the control device 180 which carries out at least a post-heating operation for cooling the post-wafer 202 while controlling the temperature before the post-wafer 202 with bumps formed at the bonding stage 110 is stored in the second storage container 206, which is a characteristic operation of the embodiment to be detailed later. Although the wafers 201, 202 in the following description are 3-inch compound semiconductor wafers, needless to say, a type and a size of the wafers are not restricted to this.

Figure 7:
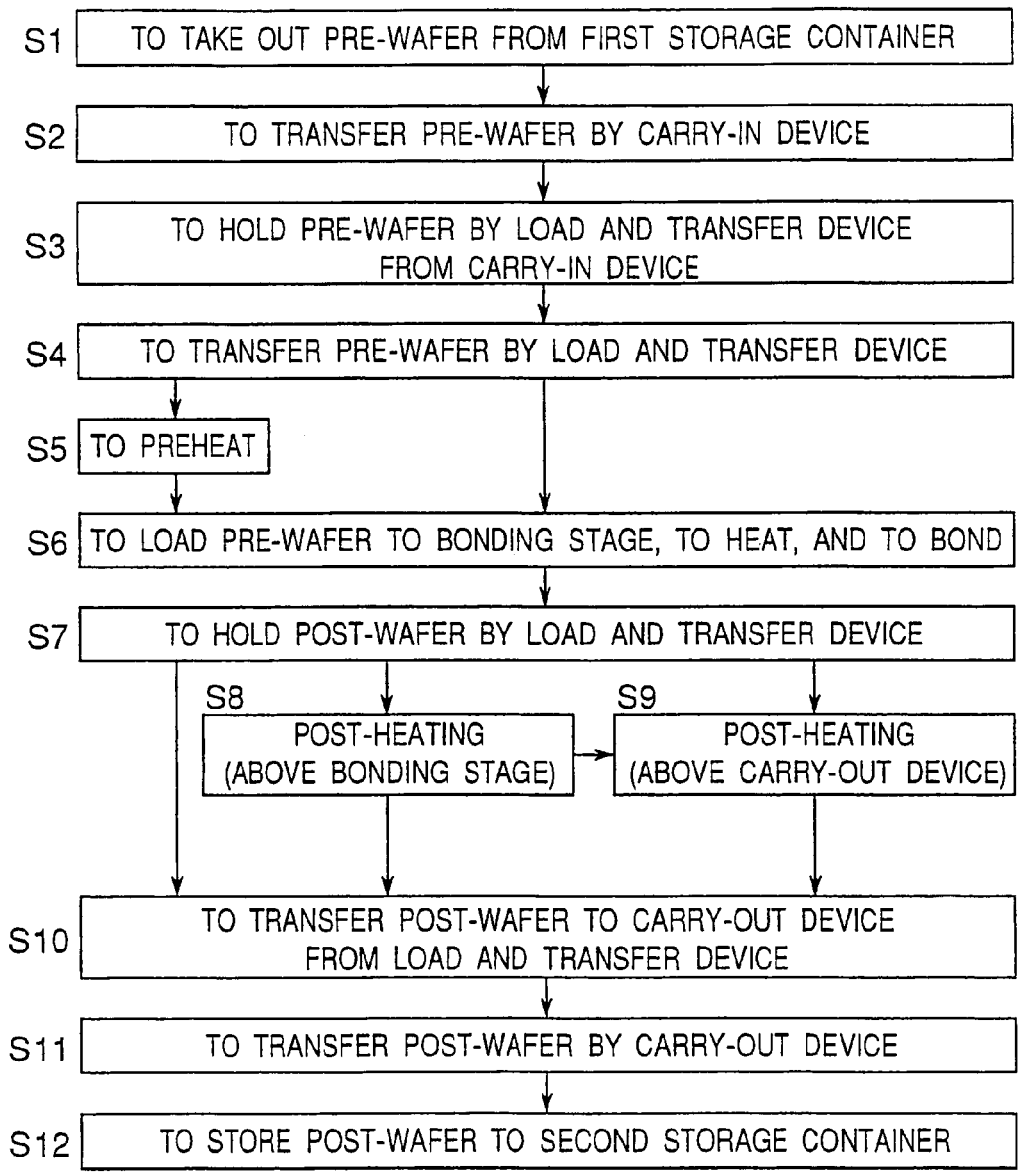
FIG. 7 is a flow chart showing operations in a bump formation method carried out by the bump forming apparatus of FIG. 1.

The first lifter 151 operates to move up or down the first storage container 205 so that the pre-wafer 201 is arranged at a take-out position where the wafer can be taken out from the first storage container 205 by the carry-in device 131. As shown in FIG. 7, in a step (indicated by "S" in the drawing) 1, the carry-in device 131 moves to the first storage container 205, and the move-side holding member 1311 and the fixed-side holding member 1312 of the carry-in device 131 hold the pre-wafer 201. In a next step 2, the held wafer 201 is taken out from the first storage container 205 and transferred. In a following step 3, the holding part 141 of the load and transfer device 140 moves to a position above the pre-wafer 201 held by the carry-in device 131, the move part 143 of the load and transfer device 140 drives to lower the holding part 141, and the cylinder 14131 of the holding part 141 drives to separate the first clamp member 1411 and separate the second clamp member 1412. The cylinder 14131 operates to bring the first clamp member 1411 and the second clamp member 1412 close together, thereby holding the pre-wafer 201. In a succeeding step 4, the holding part 141 moves up and the drive part 142 shifts the holding part 141 to a position above the bonding stage 110.

In the embodiment, before the pre-wafer 201 is placed on the bonding stage 110, the pre-wafer 201 is preheated while being held by the holding part 141 (step 5). If the pre-wafer 201 at normal temperature is immediately placed on the bonding stage 110 and heated to a temperature for bump bonding which is approximately 150° C. at maximum, the wafer (if it is the compound semiconductor wafer sensitive to a temperature change) will probably develop a circuit destruction or the above-mentioned crack because of the pyroelectric effect. Thus, the wafer is preheated for avoiding this.

Figure 8:
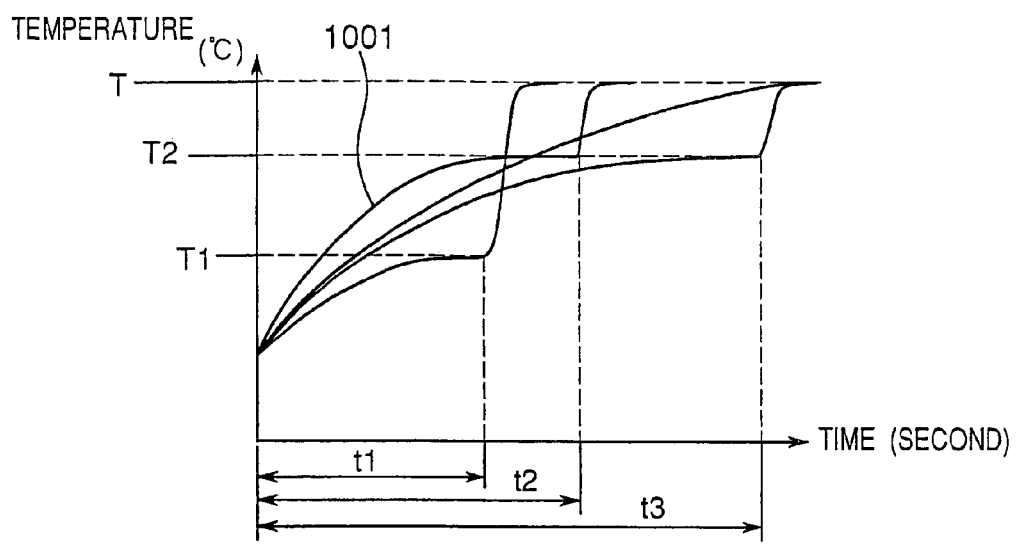
FIG. 8 is a graph of various temperature rise curves at the time of preheating in step 5 of FIG. 7.
Figure 9:
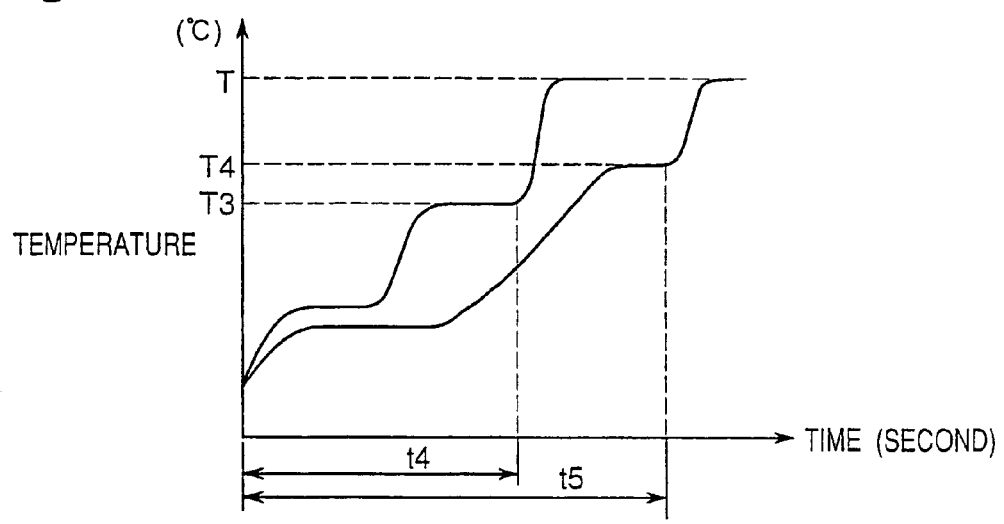
FIG. 9 is a graph of various temperature rise curves at the preheating in step 5 of FIG. 7.

As a concrete way of preheating, in the embodiment, the pre-wafer 201 held by the holding part 141 is arranged above the bonding stage 110 which is already heated to nearly the temperature for bump bonding, in a noncontact state opposite to the bonding stage 110, so that the wafer is heated by radiant heat from the bonding stage 110. A temperature-rise controlling of the pre-wafer 201 in the preheating method can be controlled by controlling at least either a size of a gap between the bonding stage 110 and the pre-wafer 201, or the period of time during which the pre-wafer 201 is at the position. A combination of the gap size and the time also enables various kinds of control as shown in FIGS. 8 and 9. FIG. 8 shows a case in which the gap size and arrangement time are not changed during a preheating operation. In other words, this graph shows a temperature rise curve in the case of a one-stage preheating type in which the pre-wafer 201 is placed on the bonding stage 110 at a time point when the pre-wafer 201 reaches an equilibrium state of a temperature of the pre-wafer 201 and is then heated to the temperature for bump bonding. On the other hand, FIG. 9 shows a case in which the gap size and arrangement time are changed during the preheating operation, namely, the temperature rise curve in the case of a multiple-stage preheating type. In FIGS. 8 and 9, t1, t2, t3, t4, t5 are times used for the preheating and, T1, T2, T3, T4 are temperatures in the equilibrium state in the preheating operation. T is the temperature for bump bonding. The temperature rise curve represented by 1001 corresponds to this embodiment and has a temperature increase rate in which it takes approximately 90 seconds to raise the temperature of the wafer to 80° C.

A condition for selecting an appropriate control among the various temperature rise controls is selected on the basis of at least one of a material of the semiconductor wafer and a thickness of the semiconductor wafer. The material of the semiconductor wafer means, for example, a type of the wafer (that is, whether the wafer is a silicon wafer or compound semiconductor wafer, and further the kind of compound of the semiconductor wafer).

Patterns of the various temperature rise controls may be stored as a program for the preheating into a memory part of the control device 180 beforehand, so that the control device 180 can automatically select a temperature rise control appropriate for the preheating on the basis of at least one of the material and thickness of the semiconductor wafer input to the control device 180. Also the temperature rise control may be carried out on the basis of information on an actual temperature of the pre-wafer 201, which information is supplied to the control device 180 from the temperature measuring device 1419 set on the holding part 141.

The preheating is executed by using the heat of the bonding stage 110 in the embodiment. The preheating is not restricted to this, however, and a heating device for the preheating may be separately provided.

The operation can shift from step 4 directly to a step 6 described below, although the step 5 is executed in the embodiment.

In the step 6, similar to the conventional bump forming apparatus, the load and transfer device 140 places the pre-wafer 201 onto the heated bonding stage 110, whereby the pre-wafer 201 is heated to the temperature for bump bonding. Then, the bump forming head 120, while being moved by the X, Y-table 122 to bump formation points, forms bumps onto the wafer 201.

After the bumps are formed at all required points, the load and transfer device 140 holds the post-wafer 202 on the bonding stage 110 in a step 7. After the step 7 (i.e., in either a step 8 or a step 9), the post-heat operation which is one of the characteristic features of the embodiment is carried out. If the post-wafer 202 at the temperature for bump bonding is immediately placed on the loading member 1321 at the normal temperature of the carry-out device 132, the heat is transmitted from the post-wafer 202 to the loading member 1321, thereby possibly breaking the semiconductor wafer when the semiconductor wafer is a compound semiconductor wafer which is sensitive to the temperature change, or bringing about similar trouble. For preventing this, the wafer 202 is cooled while a temperature drop is controlled. As a way of conducting the post-heating according to the embodiment, the post-wafer 202 is arranged above the bonding stage 110 by the load and transfer device 140, similar to the above preventing (in step 8). Alternatively, the post-wafer 202 is positioned by the load and transfer device 140 at a cooling position other than above the bonding stage 110 (for instance, above the loading member 1321 of the carry-out device 132, which is carried out in the step 9). In any way, the post-wafer 202 is prevented from immediately contacting the loading member 1321 having the normal temperature, and the temperature drop of the post-wafer 202 is delayed. The post-heating operation is not limited to these methods and can be carried out in various manners as described later.

Figure 10:
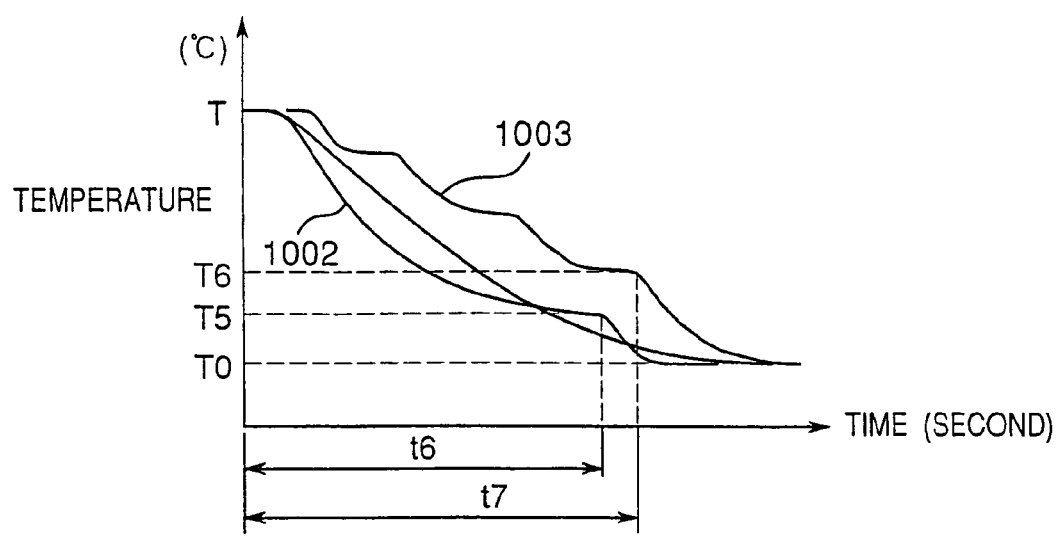
FIG. 10 is a graph of temperature drop curves in step 8 or 9 of FIG. 7.

In the post-heating operation executed in the step 8, either or both of the gap size and arrangement time are changed in the same manner as in the preheating operation executed in the step 5, whereby the temperature drop is controlled to represent, for example as shown in FIG. 10, a temperature drop curve nearly inverse to the temperature rise curve shown in FIGS. 8 and 9. A graph indicated by 1002 is the temperature drop curve when the gap size and arrangement time are not changed during the post-heating operation, similar to the aforementioned one-stage preheating type. On the other hand, a graph designated by 1003 is the temperature drop curve when the gap size and arrangement time are changed during the post-heating operation, similar to the multi-stage preheating type. t6, t7 are times spent for the post-heating, and T5, T6 are temperatures in an equilibrium state in the post-heating operation. T0 is the normal temperature. The post-wafer 202 is moved to the loading member 1321 of the carry-out device 132 at a point in time after the above time t6, t7 has passed.

Similar to the preheating operation, the control of the temperature drop is selected from among various kinds on the basis of at least either of the material and the thickness of the wafer 201, 202.

Also similar to the preheating operation, patterns of various kinds of temperature drop controls may be stored beforehand as a program for the post-heating in the memory part of the control device 180, so that the temperature drop control appropriate to the post-heating is automatically selected by the control device 180 based on at least one of the material and thickness of the semiconductor wafer input to the control device 180. Alternatively, the temperature drop control may be performed on the basis of information regarding an actual temperature of the post-wafer 202 which is supplied from the temperature measuring device 1419 of the holding part 141 to the control device 180.

The post-heating is executed in the embodiment by using heat from the bonding stage 110, but the post-heating is not limited to this. A heating device for the post-heating may be set separately.

Since the heat emitted from the bonding stage 110 will not act in the post-heating operation carried out in the step 9 in contrast to step 8, the temperature of the post-wafer 202 drops faster in step 9 than in the step 8. However, the cooling speed is slow because of the absence of heat transmission to the loading member 1321 in comparison with the case when the wafer is placed onto the loading member 1321 immediately after bumps are formed, and consequently troubles such as the above-referred crack or the like are eliminated even from the above compound semiconductor wafer.

Herein a relationship between rates of the temperature rise and temperature drop in the above preheating operation and post-heating operation, and the material and thickness of the semiconductor wafer, will be described.

Silicon and quartz semiconductor wafers can be relatively rapidly heated and cooled as compared with wafers of materials described below. For compound semiconductor wafers of lithium tantalum and lithium niobium, a temperature change rate of 50° C./min or lower is preferred to prevent cracking during both the heating and the cooling, and in order to make sure of the operation of the electric circuit, a temperature change rate of 3° C./min or lower is preferred. The operation of the electric circuit is sufficiently ensured even at a rate exceeding the above 3° C./min. The temperature rise rate of about 50° C./10 sec is allowed in some cases, whereas the temperature drop control is severer in condition. Although not determined at present, the above condition of the lithium tantalum and lithium niobium semiconductor wafers may support a condition for semiconductor wafers of gallium arsenide.

A clear relationship between the thickness and the temperature rise rate and temperature drop rate has not been clearly established at present. However, the wafer when held by the holding part of the transfer and load device is easier to deflect by a holding force of the holding part because the wafer is thinner. Therefore, a small thickness is considered disadvantageous.

Although either step 8 or step 9 should be carried out (and the embodiment carries out step 9), an executed process is not limited to this. In other words, step 8 and then step 9 may be sequentially carried out in this order depending on the material and thickness. Furthermore, since the temperature-controlled air can be sent by the air blast device 1325 as described earlier at the loading member 1321 of the embodiment, it is possible to preliminarily raise the loading member 1321 to not lower than the normal temperature by the air, or the temperature drop of the post-wafer 202 placed on the loading member 1321 can be delayed by the air. In such structure, the step 7 may be followed by a step 10 to be depicted below depending on the material and thickness of the semiconductor wafer.

The above-described arrangement of blowing the temperature-controlled air from the loading member 1321 can also prevent generation of problems such as cracking or the like in the compound semiconductor wafers.

Since the temperature drop of the wafer 202 is controllable by blowing the temperature-controlled air as indicated above, the wafer 202 can be moved onto the loading member 1321 without waiting for the temperature equilibrium state thereof by the post-heating. Therefore, if the apparatus has only one load and transfer device 140, the load and transfer device 140 can be more quickly freed from the operation of holding the wafer 202 during the post-heating, so that a lead time is shortened.

In the step 10 after step 8 or step 9, the post-wafer 202 is moved from the load and transfer device 140 to the loading member 1321 of the carry-out device 132.

In step 11, the post-wafer 202 is transferred by the carry-out device 132 in the second storage container 206. In a step 12, the post-wafer 202 is stored by the carry-out device 132 to the second storage container 206 set by the second lifter 152 to a height whereat the container can store the post-wafer 202. The operation from the above step 10 through step 12 is equal to the operation in the conventional art.

According to the bump forming apparatus 101 and bump formation method of the embodiment as described hereinabove, the pre-wafer 201 is not directly heated by the bonding stage 110 to the temperature for bump bonding, but is preheated in the preheating operation while the temperature rise is controlled. Troubles such as a circuit break caused by a pyroelectric effect, cracking because of thermal deformation and the like are prevented even when compound semiconductor wafers sensitive to the temperature change are handled. Moreover, the post-wafer 202 is not directly moved onto the loading member 1321 (at the normal-temperature) of the carry-out device 132 when at the temperature for bump bonding, but is cooled in the post-heating operation while the temperature drop is controlled. Therefore, generation of troubles such as the above circuit break, cracking or the like is eliminated even when the compound semiconductor wafers are handled.

As modified embodiments of the above-described bump forming apparatus 101, the following constitutions may be adopted.

In the above-described embodiment, the loading member 1321 of the carry-out device 132 is formed of a metallic sheet. A thermal insulating material, specifically a resin material, may be applied to a contact part of the loading member for contacting the post-wafer 202, as in carry-out devices 251-253 shown in FIGS. 11-13, whereby cooling of the post-wafer 202 which is higher than the normal temperature can be delayed.

Figure 11:
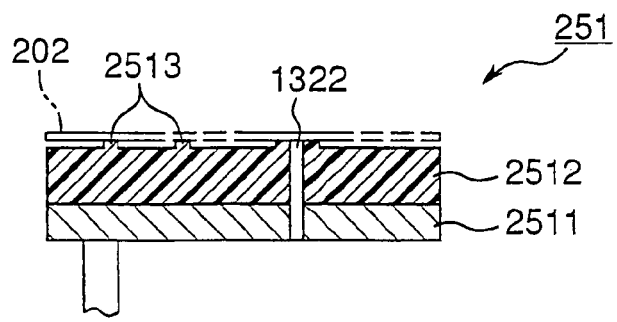
FIG. 11 is a sectional view of a modified example of a carry-out device shown in FIG. 1.

More specifically, in the carry-out device 251 in FIG. 11, a thermal insulating material 2512 is set on the metallic loading member 2511, thereby preventing the loading member 2511 from being in direct contact with the post-wafer 202. The thermal insulating material 2512 as a resin material makes it difficult to transmit heat from the post-wafer 202 to the loading member 2511. Furthermore, the thermal insulating material 2512 has projections 2513 so that the post-wafer 202 is brought in point contact with the thermal insulating material 2512, thereby further obstructing the heat transmission. In the constitution as described above, the temperature drop of the post-wafer 202 can be delayed in comparison with the case in which the post-wafer 202 is directly placed on the metallic loading member 1321.

Figure 12:
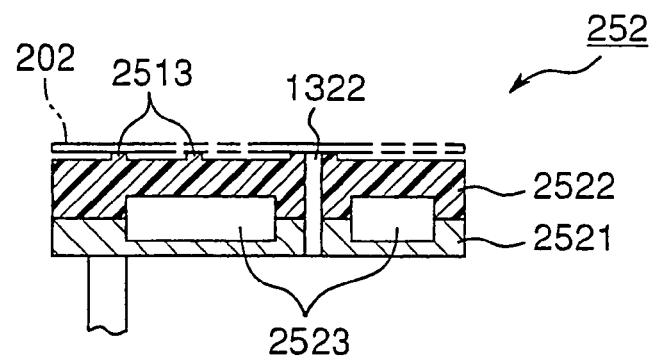
FIG. 12 is a sectional view of a modified example of the carry-out device shown in FIG. 1.
Figure 13:
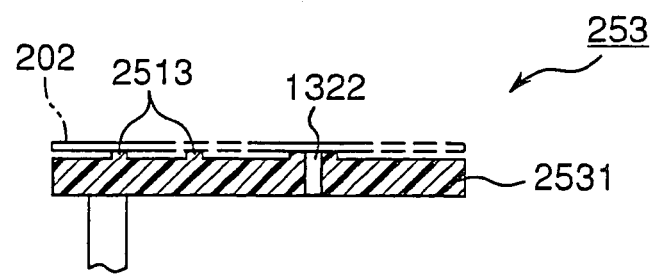
FIG. 13 is a sectional view of a modified example of the carry-out device shown in FIG. 1.

The carry-out device 252 in FIG. 12 has an air layer 2523 formed between the loading member 2521 and a thermal insulating member 2522 in addition to the structure of the above carry-out device 251. The heat transmission from the insulating material 2522 to the metallic loading member 2521 is easy to block by forming the air layer 2523 having a heat insulation effect. Therefore, the temperature drop of the post-wafer 202 can be delayed more than in the above carry-out device 251.

The reason for setting the thermal insulating material on the metallic loading member as in the carry-out device 251 and carry-out device 252 is to provide a smooth load face of the thermal insulating material where the post-wafer 202 is loaded by forming the smooth face on the metallic loading member to which a plane processing can be done easier. However, if the load face of the thermal insulating material can be made smooth easier, the loading member for the post-wafer 202 can be formed only of the thermal insulating material 2531 as in the carry-out device 253 shown in FIG. 13.

Since the speed for cooling the post-wafer 202 can be delayed in the carry-out devices 251-253 with the thermal insulating material as described above, step 8 or 9 may or may not be carried out.

Figure 14:
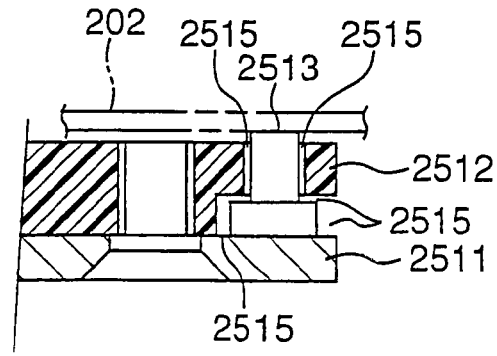
FIG. 14 is a sectional view of a projecting part included in the carry-out device shown in FIGS. 11-13.

As indicated in FIG. 14 exemplifying the carry-out device 251, a projection 2513 is set with gaps 2515 in the thermal insulating material 2512 and loading member 2511. When the post-wafer 202 moves in an orthogonal direction with respect to a thicknesswise direction thereof after being loaded on the carry-out device 251, the projection 2513 can move together with the post-wafer 202 in the orthogonal direction at the gaps. If the projection is fixed while the post-wafer 202 moves, the projection and the post-wafer 202 rub each other thereby unfavorably damaging the post-wafer 202. However, the possibility of damage is eliminated by designing the projection 2513 to move with the post-wafer 202 in the same direction as above.

As shown in the drawing, the projection 2513 is provided in the thermal insulating material 2512 via the gap 2515 also in the thicknesswise direction of the post-wafer 202. Consequently, the projection 2513 can also move in the thicknesswise direction of the wafer 202.

The projection 2513 alone may be formed of a material different from the material of the thermal insulating material 2512, 2522, 2531.

Figure 15:
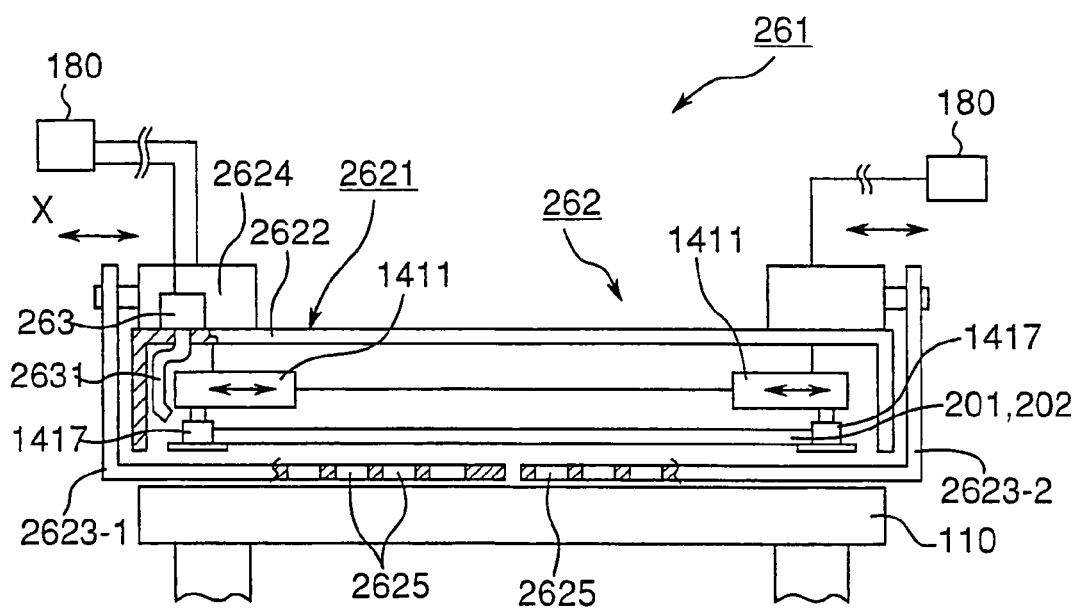
FIG. 15 is a diagram of a modified example of the load and transfer device of FIG. 1.

In order to thermally insulate the pre-wafer 201 and post-wafer 202 better than in the present embodiment, the load and transfer device 140 may be provided with a heat insulation device. FIG. 15 shows a load and transfer device 261 obtained by mounting a heat insulation device 262 on the load and transfer device 140.

The heat insulation device 262 has a member 2621 for covering, and a driving part 2624. The member 2621 for covering is a heat insulation member for the wafer 201, 202, including an upper cover 2622 and a lower shutter 2623 which are arranged in the thicknesswise direction of the wafer 201, 202 and are arranged to cover the holding part 141 having the first clamp member 1411 and second clamp member 1412. The lower shutter 2623 is constituted of two lower portions 2623-1, 2623-2 opened right and left by the driving part 2624 in a diametrical direction with respect to the wafer 201, 202 held by the holding part 141. Each of the lower shutter portions 2623-1, 2623-2 has a plurality of openings 2625 formed to penetrate the lower shutter 2623-1, 2623-2 so that the heat from the bonding stage 110 easily acts upon the wafer 201, 202.

Because of the presence of the heat insulation device 262 constituted as described above, when the wafer 201, 202 is disposed above the bonding stage 110 in the earlier-described step 5 and step 8 with the lower shutter 2623 closed and the wafer 201, 202 held, the heat from the bonding stage 110 stays in the member 2621 for covering. As a result, the wafer 201, 202 can be insulated thermally.

Moreover, the heat insulation device 262 can be equipped with a heat insulation assisting device 263 for blowing a temperature-controlled gas (to assist heat insulation for the wafer 201,202) onto the wafer 201, 202 held within the member 2621 for covering. In the present embodiment, the gas is nitrogen gas, which is guided by a pipe 2631 to flow along a surface of the wafer 201, 202 and is blown to the wafer 201, 202. The entire wafer 201, 202 can be kept at a uniform temperature by the blowing of the gas. Oxidation of electrodes formed on the wafer 201, 202 can be also prevented when the nitrogen gas or an inert gas is blown.

For shortening the lead time in the bump formation process as well as preventing generation of troubles such as breakage of the wafer 201, 202, an arrangement to be described below can be provided in addition to the constitution of the above embodiment and its modified example.

Figure 4:
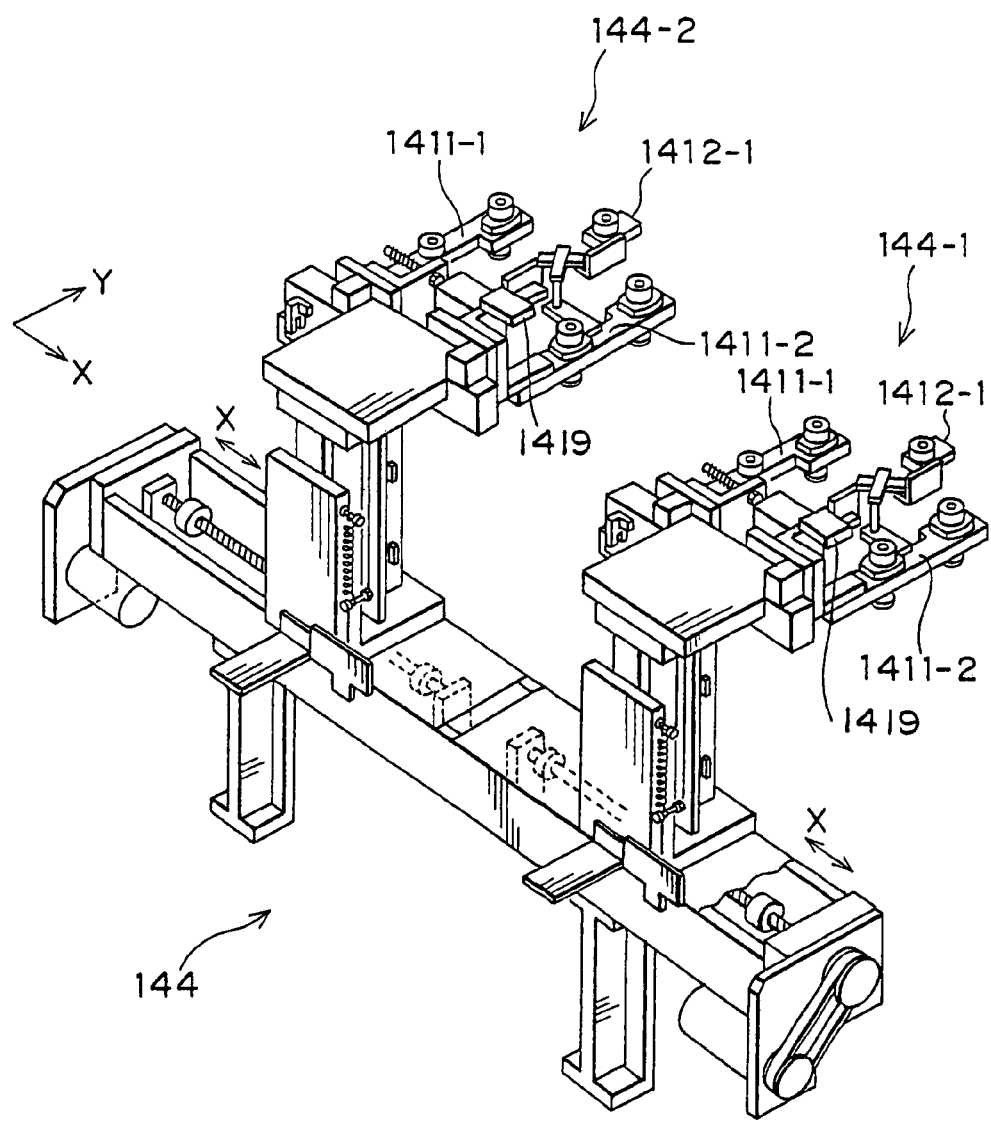
FIG. 4 is a perspective view of a modification of the load and transfer device of FIG. 3.

More specifically, while the load and transfer device 140 of the embodiment has only one holding part 141 as discussed above, two holding parts 144-1, 144-2 may be provided as in a load and transfer device 144 of FIG. 4. Then the holding parts 144-1, 144-2 may be driven independently so that, for example, the holding part 144-1 loads and transfers pre-wafer 201, and the holding part 144-2 loads and transfers the post-wafer 202. A temperature measuring device 1419 is provided for each of the holding parts 144-1, 144-2.

Each of operations for loading and transferring the pre-wafer 201 and post-wafer 202 can be shared by the holding parts respectively in the above constitution, so that the lead time can be shortened.

Figure 16:
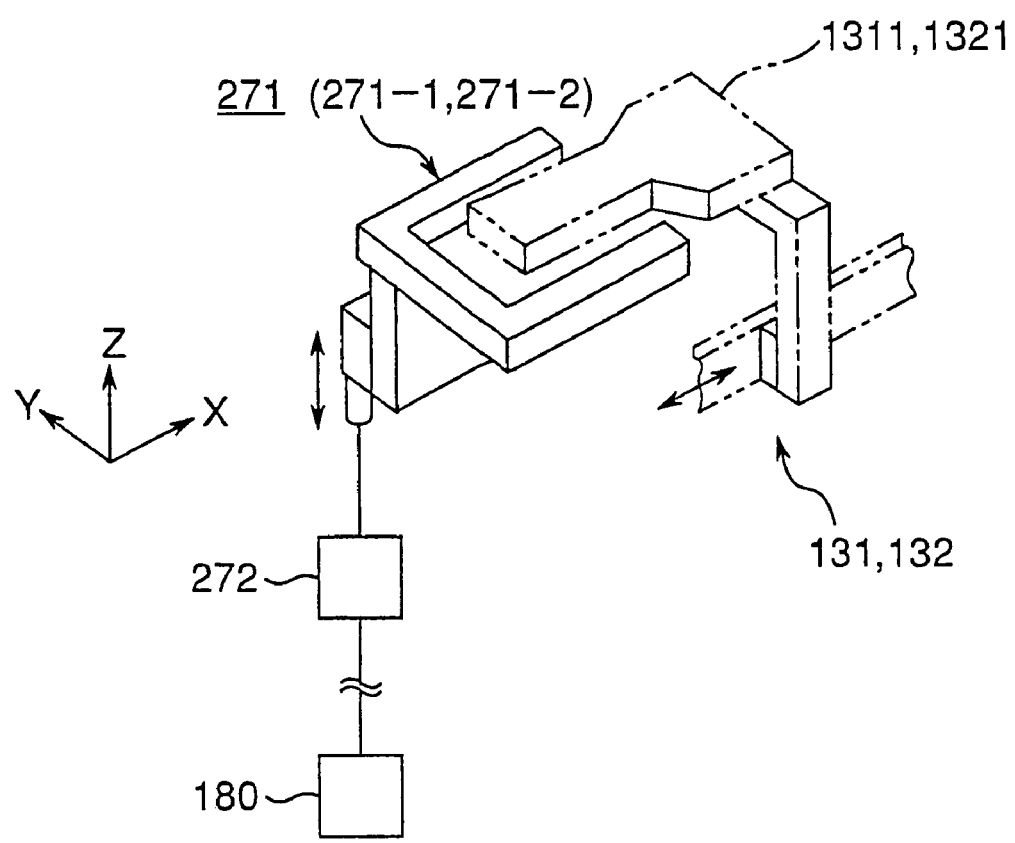
FIG. 16 is a perspective view of a temporary holding member included in a modified example of the bump forming apparatus of FIG. 1.

In the case of only one load and transfer device 140, a temporary holding member 271 can be provided on at least one of the carry-in device 131 and the carry-out device 132 as shown in FIG. 16. Supposing that the temporary holding member 271 provided on the carry-in device 131 is a first temporary holding member 271-1, and the temporary holding member 271 provided on the carry-out device 132 is a second temporary holding member 271-2, in the example of the carry-in device 131, the first temporary holding member 271-1 is formed in a U-shape so as to hold the loading member 1321 and is moved up and down in the thicknesswise direction of the wafer 202 placed on the loading member 1321 by a driving device 272 controlled in operation by the control device 180. When the first temporary holding member 271-1 is provided as described above, the wafer 201 can be delivered between the loading member 1321 and the first temporary holding member 271-1, while the loading member 1321 can take out the next pre-wafer 201. The lead time can be accordingly shortened. The operation and effect as described above are equally achieved in the case of the second temporary holding member 271-2.

Figure 17:
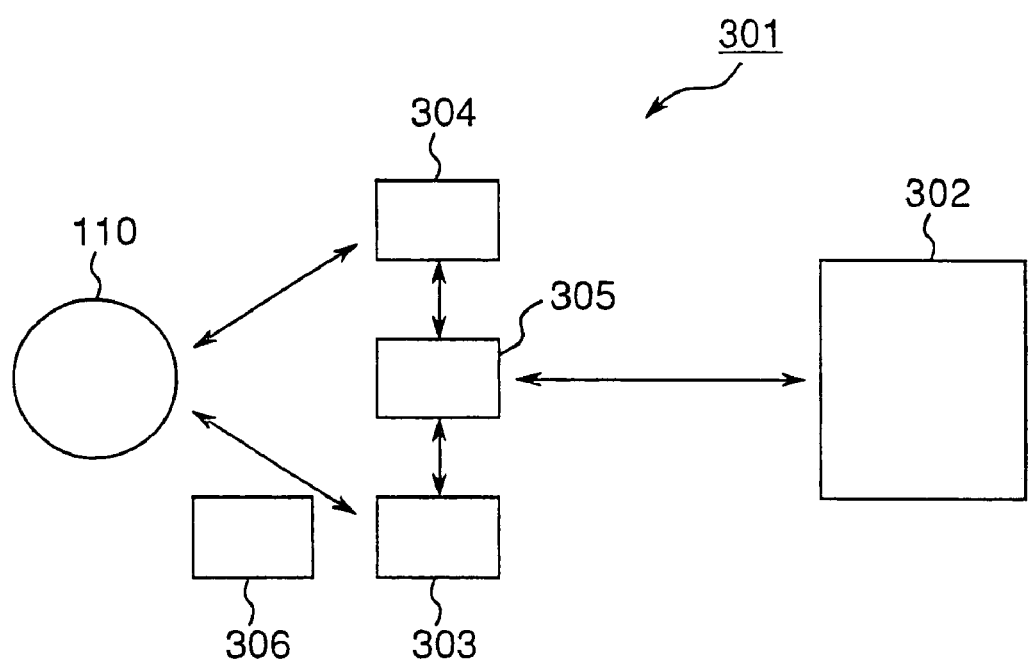
FIG. 17 is a block diagram of a modified example of the bump forming apparatus of FIG. 1.

As indicated in FIG. 17, in a bump forming apparatus 301 of the so-called single magazine type with only one storage container 302 for the wafers 201, 202, there are included a temporary holding member 303 with a heater in addition to the above temporary holding member, the above temporary holding member 304, a transfer device 305 for sending the wafers 201, 202 in and out of the storage container 302, and a load and transfer device 306. According to the arrangement, for example, while the pre-wafer 201 taken out by the transfer device 305 is placed and preheated by the temporary holding member 303 with the heater, the next pre-wafer 201 can be taken by the freed transfer device 305, and the post-wafer 202 can be moved by the load and transfer device 306 to the temporary holding member 304 from the bonding stage 110. Since operations can be executed concurrently with the use of the temporary holding member, the lead time can be shortened even in the single magazine type. In the above constitution, the temporary holding member 303 with the heater is preferably provided with an appropriate cooling device because the temporary holding member 303 is required to be cooled to nearly the normal temperature after preheating before the next pre-wafer 201 is loaded.

Second Embodiment

A semiconductor wafer having a semiconductor circuit formed on, e.g., a quartz substrate (referred to as a "quartz semiconductor wafer" hereinbelow) has a problem yet to be solved as shown below, although the compound semiconductor wafer primarily exemplified in the foregoing description is less troubled. The quartz semiconductor wafer discussed here has a diameter of 3 inches and a thickness of 0.3-0.35 mm, but is not limited to this size.

Figure 19:
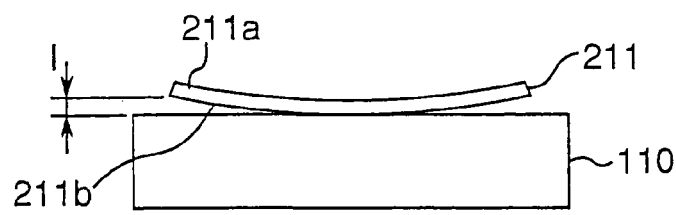
FIG. 19 is a diagram of a state in which a quartz semiconductor wafer is warp on a bonding stage.

From a view point of facilitating bump formation onto the semiconductor wafer, the temperature for bump bonding is preferably as high as possible (for instance, approximately 250-270° C. for silicon wafers, and approximately 150° C. for lithium tantalum wafers). The quartz semiconductor wafer is not an exception. However, a phenomenon below takes place in experiments conducted by the applicant, in which the preheated quartz semiconductor wafer is placed on the bonding stage set at various temperatures and heated to a temperature for bump bonding. Even when the bonding stage is gradually heated with a temperature rise rate of 5° C./min, a quartz semiconductor wafer 211 is warped as illustrated in FIG. 19 when the bonding stage reaches approximately 250° C. Specifically, the wafer 211 is warped when a stage contact face 211b of the quartz semiconductor wafer 211 in contact with the bonding stage reaches the above temperature of the bonding stage, i.e., approximately 250° C. Also, if a temperature difference between the bonding stage and the quartz semiconductor wafer 211 immediately before being placed on the bonding stage is approximately 50° C., the quartz semiconductor wafer 211 is warped as indicated in FIG. 19. The warpage is brought about if the quartz semiconductor wafer is rapidly heated (e.g., heated at a rate of 20° C./min) even when the temperature difference is not larger than 50° C.

A concrete value of the warpage, i.e., a size I in FIG. 19, is approximately 2 mm.

The quartz semiconductor wafer 211 in a state in which the wafer is warped cannot be sucked onto the bonding stage, and bumps cannot be formed on the warped quartz semiconductor wafer 211. If the warped quartz semiconductor wafer 211 is forcibly sucked onto the bonding stage, the quartz semiconductor wafer 211 cracks.

A cause of the warpage is considered to result substantially from the physical properties of the quartz semiconductor wafer 211, but is directly due to a nonuniformity in the temperature of the quartz semiconductor wafer 211 in the thicknesswise direction. In other words, although the stage contact face 211b of the quartz semiconductor wafer 211 is rapidly heated when placed on the bonding stage, a temperature rise speed of a circuit formation face 211a of the quartz semiconductor wafer 211 opposite to the stage contact face 211b is lower as compared with the stage contact face 211b, thereby bringing about a temperature difference between the stage contact face 211b and circuit formation face 211a. The temperature difference creates the warpage of the quartz semiconductor wafer.

Figure 18:
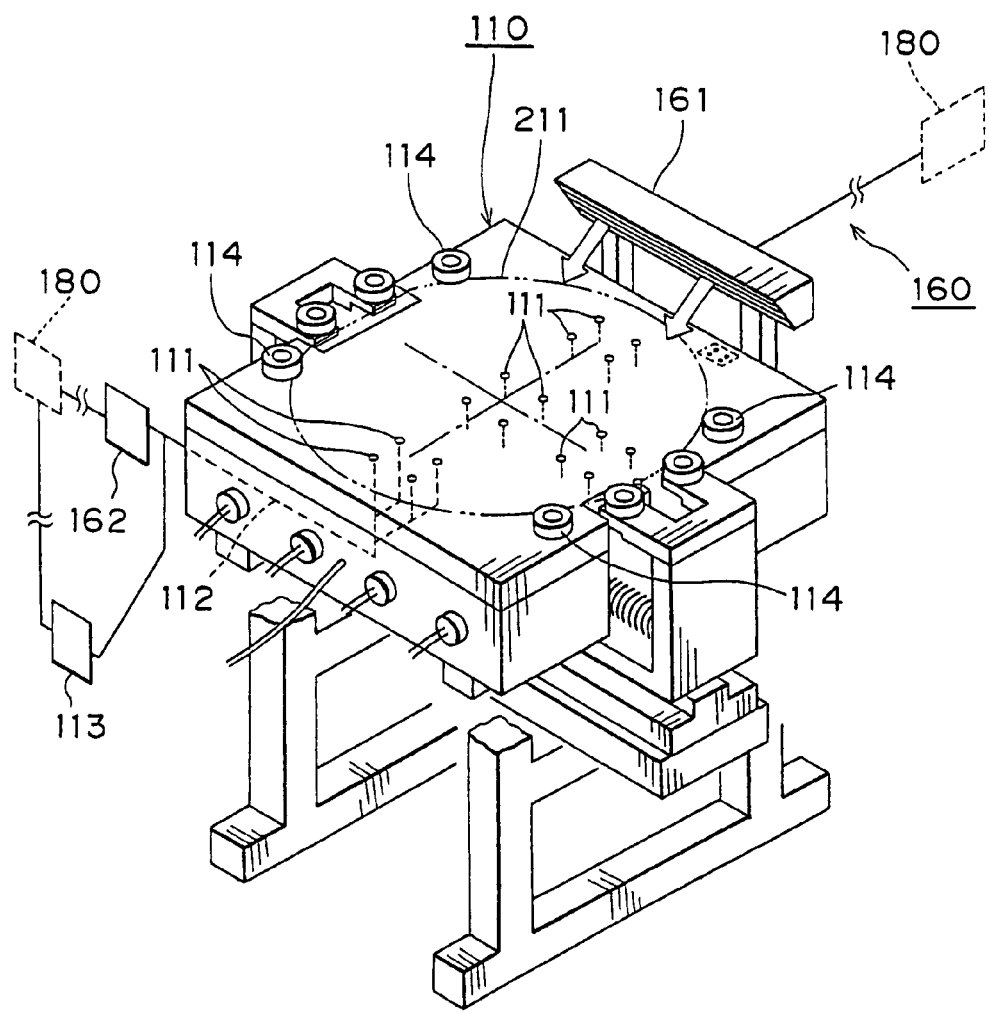
FIG. 18 is a perspective view of the bump forming apparatus in FIG. 1 in which a heating air blow device constitutes a wafer temperature control device.

In the embodiment, a wafer temperature control device 160 is provided as shown in FIG. 1 or 18, which controls the temperature difference between the circuit formation face 211a and the stage contact face 211b within a warpage non-generation temperature range where the warpage of the quartz semiconductor wafer 211 placed on the bonding stage 110 is restricted to an amount not impeding the bump formation to the loaded quartz semiconductor wafer 211, specifically, 50 μm in the embodiment. The above amount of warpage corresponds to the size represented by "I" in FIG. 19 in a state before the warped quartz semiconductor wafer 211 is sucked to the bonding stage 110. When bumps are actually formed, the above 50 μm becomes not larger than approximately 20 μm because of the suction operation. The wafer temperature control device 160 heats the circuit formation face 211a of the quartz semiconductor wafer 211 placed on the bonding stage 110, or cools the stage contact face 211b so as to keep the temperature difference in the warpage non-generation temperature range. The warpage non-generation temperature range is within approximately 20° C. based on the result of the experiments.

In one form of heating the circuit formation face 211a, a heating air blow device 161 is provided on the wafer temperature control device 160 as shown in a detailed manner in FIG. 18. The heating air blow device 161 is arranged at a position so as not to interfere with the operation of the bump forming head 120 in a back side of the bonding stage 110. The heating air blow device 161 blasts heating air having a temperature which accommodates the temperature difference within the warpage non-generation temperature range to an entire area or almost the entire area of the circuit formation face 211a of the quartz semiconductor wafer 211 placed on the bonding stage 110. For example, the bonding stage 110 is set to 200° C. and the heating air of 200° C. is sent out for approximately 30 seconds from the heating air blow device 161.

The position at which the heating air blow device 161 is installed is not limited to the above position and, e.g., can also be arranged at a front side of the bonding stage 110. The heating air blow device 161 is connected to the control device 180, and the temperature, a blowing time, a volume, a velocity of the heating air, and similar properties are controlled on the basis of a relationship to the temperature of the bonding stage 110.

Meanwhile, a cooling air supply device 162 may be arranged in a way to cool the stage contact face 211b in the wafer temperature control device 160 as clearly indicated in FIG. 18. A plurality of suction holes 111 are formed in the bonding stage conventionally for sucking the semiconductor wafer, and the junction holes 111 communicate with a suction device 113 through an air passage 112. The cooling air supply device 162 is connected to the air passage 122 and supplies cooling air via the air passage 122 to an entire area or almost the entire area of the stage contact face 211b. Since projections 114 for positioning and supporting the placed semiconductor wafer are formed on the bonding stage 110, the quartz semiconductor wafer 211 is prevented from dropping from the bonding stage 110 as a result of the supply of the cooling air by the cooling air supply device 162. The cooling air supply device 162 is connected to the control device 180, and a temperature, a supply time, a volume, a velocity, and similar properties of the cooling air are controlled on the basis of a relationship to the temperature of the bonding stage 110. In the embodiment, when the bonding stage 110 is set to 200° C., the cooling air is sent out from the cooling air supply device 162 for about 20 seconds. The cooling air temperature immediately after being sent out from the cooling air supply device 162 and before reaching the stage contact face 211b is 185° C.

As a way for correcting the warpage, normally, setting the heating air blow device 161 for heating the circuit formation face 211a which is lower in temperature than the stage contact face 211b is preferred. However, in the case of setting the cooling air supply device 162, conveniently, since the existing air passage 112 can be utilized and an installation position thereof can be selected with a high degree of flexibility, the cooling air supply device 162 is more convenient than the heating air blow device 161.

Figure 20:
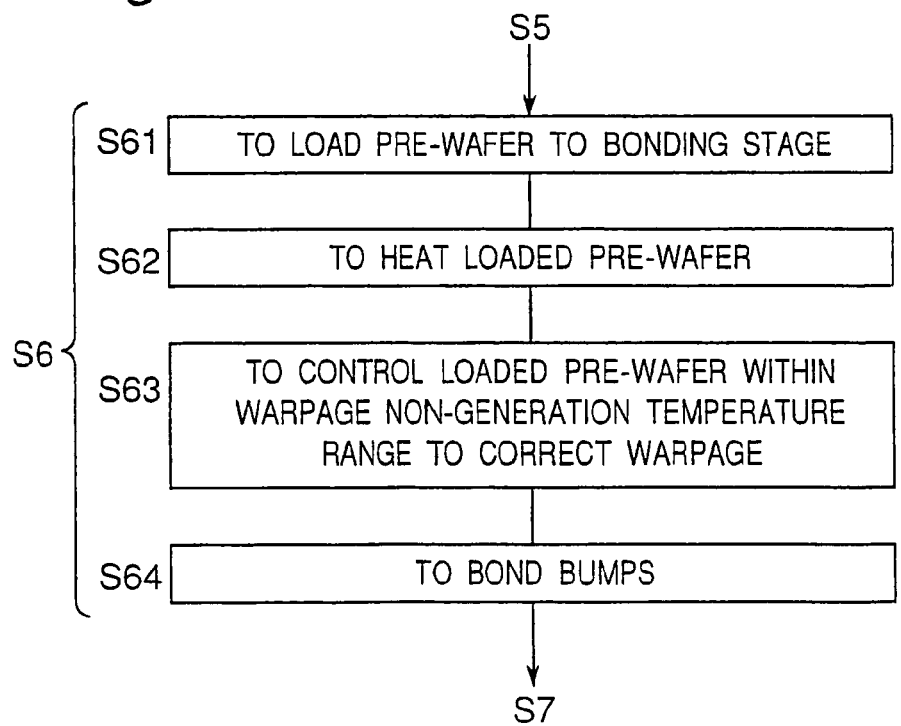
FIG. 20 is a flow chart of operation in step 6 of FIG. 7 in the case where the bump forming apparatus of FIG. 1 is provided with the wafer temperature control device.

Operation of the wafer temperature control device 160 constituted as described above will be discussed with reference to FIG. 20. The operation shown in FIG. 20 corresponds to the heating and bonding operation of the quartz semiconductor wafer 211 in step 6 of FIG. 7. The cooling air supply device 162 is employed by way of example of the wafer temperature control device 160 in the embodiment.

In the present embodiment, the bonding stage 110 is set to 200° C. As described before, since the temperature difference between the bonding stage 110 and the quartz semiconductor wafer 211 placed on the bonding stage 110 should be within approximately 50° C., the preheating is carried out in step 5 to the quartz semiconductor wafer 211. The preheating in this embodiment is conducted in two stages according to the embodiment as described with reference to FIG. 8. The quartz semiconductor wafer 211 is first raised to 100° C. and then heated to 150° C. The circuit formation face 211a and stage contact face 211b of the quartz semiconductor wafer 211 become equal in temperature at a point in time when the preheating is completed.

In step 61, the quartz semiconductor wafer 211 is placed by the holding part 141 of the load and transfer device 140 onto the bonding stage 110. The quartz semiconductor wafer 211 is subjected to practical heating in step 62. Although the quartz semiconductor wafer 211 starts to be warped because the stage contact face 211b is quickly heated subsequent to the above placement on the bonding stage, a step 63 is executed simultaneously with the step 62. That is, the cooling air is supplied by the cooling air supply device 162 to the whole area or almost the whole area of the stage contact face 211b of the quartz semiconductor wafer 211 for about 20 seconds, so that a temperature increase ratio of the stage contact face 211b is suppressed. The temperature difference between the circuit formation face 211a and the stage contact face 211b is thus kept within the warpage non-generation temperature range in which the warpage of the quartz semiconductor wafer 211 is restricted to the amount of warpage of the wafer which does not obstruct formation of bumps to the quartz semiconductor wafer 211. Even if warpage is generated, the warpage is corrected and therefore the warpage of the quartz semiconductor wafer 211 is kept in the above described amount. According to the above operation, the quartz semiconductor wafer 211 is heated to the temperature for bonding (i.e., 200°) which is the set temperature of the bonding stage 110 in the embodiment.

In step 64, after being heated to the temperature for bonding, the quartz semiconductor wafer 211 is sucked onto the bonding stage 110 by the action of the suction device 113, and bumps are formed on the circuit formation part by the bump forming head 120.

The operation following the step 7 is carried out afterwards.

According to the embodiment as described above, the warpage of the quartz semiconductor wafer 211 is restricted during the practical heating within the amount of the warpage of the wafer whereby the formation of bumps is not hindered. Therefore, the quartz semiconductor wafer 211 can be heated to high temperatures (e.g., 200-250°) with the warpage being kept to the above amount, and thus the bumps can be formed on the quartz semiconductor wafer 211.

As described above, although the cooling air supply device 162 uniformly supplies the cooling air to the entire area or nearly the entire area of the stage contact face 211b, the temperature, a feed amount, or similar characteristics of the air may be changed based on a position on the stage contact face 211b from a view point of more effectively preventing generation of warpage. For instance, a cooling air supply device for supplying the cooling air to a central part of the quartz semiconductor wafer 211, and a cooling air supply device for supplying the cooling air to another part may be provided, and the cooling air to the central part may be lowered in temperature or increased in amount as compared to the cooling air supplied to the other part.

The quartz semiconductor wafer 211 is described by way of example in the foregoing description. However, the second embodiment is not limited to this wafer and useful to semiconductor wafers using a substance which poorly transmits heat and greatly changes a thermal expansion coefficient depending on temperatures.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bump forming apparatus comprising:
    a bonding stage for supporting a semiconductor wafer and for heating the semiconductor wafer to a temperature for forming bumps on electrodes on a circuit of the semiconductor wafer;
    a bump forming head for forming the bumps on the electrodes of the semiconductor wafer;

a load and transfer device for placing the semiconductor wafer on and removing the semiconductor wafer from said bonding stage;

a controller programmed to operate said bonding stage and said load and transfer device so as to perform a post-heating operation on the semiconductor wafer after the bumps are formed on the semiconductor wafer to thereby control a temperature drop of the semiconductor wafer, said controller being operable to control the post-heating operation on the semiconductor wafer by controlling said load and transfer device and said bonding stage so that the semiconductor wafer is positioned by said load and transfer device at a cooling position above said bonding stage while said bonding stage is heated to the temperature for forming the bumps such that the semiconductor wafer does not contact said bonding stage when in the cooling position; and a wafer temperature control device programmed to operate a temperature difference between a temperature at a bonding stage-contact face of the semiconductor wafer and a temperature at a circuit formation face of the semiconductor wafer opposite to the bonding stage-contact face before the bump formation is performed and after the semiconductor wafer is positioned on said bonding stage, said wafer temperature control device being operable to control the temperature difference to be within a warpage non-generation temperature difference range so that a warpage of the semiconductor wafer is restricted to a level not obstructing the bump formation.

2. The bump forming apparatus of claim 1, wherein said wafer temperature control device is operable to control the temperature difference by heating the circuit formation face of the semiconductor wafer placed on said bonding stage.

3. The bump forming apparatus of claim 2, wherein said wafer temperature control device is operable to heat the circuit formation face by supplying heating air to the circuit formation face of the semiconductor wafer, the heating air having a temperature for maintaining the temperature difference within the warpage non-generation temperature difference range.

4. The bump forming apparatus of claim 1, wherein said wafer temperature control device is operable to control the temperature difference by cooling the bonding stage-contact face of the semiconductor wafer placed on said bonding stage.

5. The bump forming apparatus of claim 4, wherein said wafer temperature control device is operable to cool the bonding stage-contact face by supplying cooling air to the bonding stage-contact face of the semiconductor wafer, the cooling air having a temperature for maintaining the temperature difference within the warpage non-generation temperature difference range.

6. The bump forming apparatus of claim 1, wherein said wafer temperature control device is operable to maintain the temperature difference within a warpage non-generation temperature difference range of 20° C.

7. The bump forming apparatus of claim 1, wherein the semiconductor wafer comprises a quartz-based wafer.

* * * * *

UNITED STATES PATENT AND TRADEMARK OFFICE
CERTIFICATE OF CORRECTION

| | | |
|---|---|---|
| PATENT NO. | : 7,387,229 B2 | Page 1 of 1 |
| APPLICATION NO. | : 10/761412 | |
| DATED | : June 17, 2008 | |
| INVENTOR(S) | : Makoto Imanishi et al. | |

It is certified that error appears in the above-identified patent and that said Letters Patent is hereby corrected as shown below:

ON THE TITLE PAGE

Under item (62), line 2, "now Pat. No. 6,787,391." should read --now Pat. No. 6,787,391. PCT application No. PCT/JP99/03224, filed on June 17, 1999.--.

Please insert Item (30) as follows:

--(30)  Foreign Application Priority Data
June 19, 1998    (JP)  .............. 10-173086--.

On page 2, column 2, line 9, please change "JP    09-28941" to --JP    09-289241--.

IN THE CLAIMS

In column 19, claim 1, please change "a controller programed to operate said" to --a controller for operating said--.

Signed and Sealed this

Second Day of December, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,387,229 B2 | Page 1 of 1 |
| APPLICATION NO. | : 10/761412 | |
| DATED | : June 17, 2008 | |
| INVENTOR(S) | : Makoto Imanishi et al. | |

It is certified that error appears in the above-identified patent and that said Letters Patent is hereby corrected as shown below:

ON THE TITLE PAGE

Under item (62), line 2, "now Pat. No. 6,787,391." should read --now Pat. No. 6,787,391. PCT application No. PCT/JP99/03224, filed on June 17, 1999.--.

Please insert Item (30) as follows:

--(30)  Foreign Application Priority Data
June 19, 1998    (JP)  ............. 10-173086--.

On page 2, column 2, line 9, please change "JP    09-28941" to --JP    09-289241--.

IN THE CLAIMS

In column 19, claim 1, line 4, please change "a controller programed to operate said" to --a controller for operating said--.

This certificate supersedes the Certificate of Correction issued December 2, 2008.

Signed and Sealed this

Twenty-third Day of December, 2008

JON W. DUDAS
*Director of the United States Patent and Trademark Office*